(12) United States Patent
Kim et al.

(10) Patent No.: US 10,395,979 B2
(45) Date of Patent: Aug. 27, 2019

(54) SEMICONDUCTOR DEVICES

(71) Applicant: Samsung Electronics Co., Ltd., Suwon-si, Gyeonggi-do (KR)

(72) Inventors: Inho Kim, Suwon-si (KR); Woohyun Lee, Hwaseong-si (KR); Oik Kwon, Yongin-si (KR); Sang-Kuk Kim, Seongnam-si (KR); Yeonji Kim, Suwon-si (KR); Jongchul Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/015,809

(22) Filed: Jun. 22, 2018

(65) Prior Publication Data

US 2019/0189502 A1    Jun. 20, 2019

(30) Foreign Application Priority Data

Dec. 15, 2017    (KR) .................. 10-2017-0173112

(51) Int. Cl.
| | |
|---|---|
| *H01L 27/11573* | (2017.01) |
| *H01L 21/768* | (2006.01) |
| *H01L 27/22* | (2006.01) |
| *H01L 43/12* | (2006.01) |
| *H01L 43/02* | (2006.01) |

(52) U.S. Cl.
CPC .. *H01L 21/76816* (2013.01); *H01L 21/76804* (2013.01); *H01L 27/11573* (2013.01); *H01L 27/224* (2013.01); *H01L 27/228* (2013.01); *H01L 43/12* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 6,590,290 | B1 | 7/2003 | Cronin |
| 7,064,402 | B2 | 6/2006 | Kajiyama |
| 7,259,089 | B2 | 8/2007 | Kanamura |
| 7,799,673 | B2 | 9/2010 | Arai |
| 9,685,606 | B2 | 6/2017 | Park |
| 2006/0166482 | A1 | 7/2006 | Kanamura |
| 2017/0222128 | A1 | 8/2017 | Sung |

FOREIGN PATENT DOCUMENTS

| | | |
|---|---|---|
| JP | 2010278330 | 12/2010 |
| JP | 2011100765 | 5/2011 |
| KR | 101028811 | 4/2011 |
| KR | 101159169 | 6/2012 |

*Primary Examiner* — Cheung Lee
(74) *Attorney, Agent, or Firm* — Myers Bigel, P.A.

(57) ABSTRACT

A semiconductor device includes a first lower insulating interlayer, a protection insulating layer, and a first upper insulating interlayer that are sequentially stacked on a substrate, and a conductive pattern penetrating the first upper insulating interlayer, the protection insulating layer, and the first lower insulating interlayer. The conductive pattern includes a line part extending in a direction parallel to an upper surface of the substrate and contact parts extending from the line part toward the substrate. The contact parts are separated from each other with an insulating pattern therebetween. The insulating pattern includes a portion of each of the first upper insulating interlayer, the protection insulating layer, and the first lower insulating interlayer. At least a portion of the insulating pattern has a stepped profile.

20 Claims, 13 Drawing Sheets

SEMICONDUCTOR DEVICES

CROSS-REFERENCE TO RELATED APPLICATION

This application claims priority under 35 U.S.C. § 119 to Korean Patent Application No. 10-2017-0173112, filed on Dec. 15, 2017, in the Korean Intellectual Property Office, the entire contents of which are incorporated herein by reference.

BACKGROUND

Technical Field

Example embodiments of the present disclosure relate to semiconductor devices, and more specifically, to semiconductor memory devices including a magnetic tunnel junction.

Discussion of Related Art

There is an increasing demand for semiconductor memory devices with low power consumption and high speed. To meet the demand, semiconductor memory devices have been developed as magnetic memory devices. The magnetic memory devices may have high speed and nonvolatile storage properties.

A magnetic memory device may include a magnetic tunnel junction (MTJ). The magnetic tunnel junction may include two magnetic layers and an insulating layer therebetween. A resistance value of the magnetic tunnel junction can be varied based on the magnetization directions of the two magnetic layers. When the magnetization directions of the two magnetic layers are anti-parallel, the magnetic tunnel junction may have a high resistance value. When the magnetization directions of the two magnetic layers are parallel, the magnetic tunnel junction may have a low resistance value. Data can be written/read using a difference in such resistance values.

SUMMARY

According to example embodiments of the inventive concepts, a semiconductor device may include a substrate, a first lower insulating interlayer, a protection insulating layer, and a first upper insulating interlayer that are sequentially stacked on the substrate, and a conductive pattern penetrating the first upper insulating interlayer, the protection insulating layer; and the first lower insulating interlayer. The conductive pattern may include a line part extending in a direction parallel to an upper surface of the substrate and contact parts extending from the line part toward the substrate. The contact parts may be spaced apart from each other with an insulating pattern therebetween. The insulating pattern may include a portion of the first upper insulating interlayer, a portion of the protection insulating layer, and a portion of the first lower insulating interlayer. At least a portion of the insulating pattern may have a stepped profile.

According to example embodiments of the inventive concepts, a semiconductor device may include a substrate including a cell region and a peripheral circuit region, a first lower insulating interlayer on the cell region and the peripheral circuit region, a data storage structure on the first lower insulating interlayer on the cell region, a first upper insulating interlayer on the cell region and the peripheral circuit region, the first upper insulating interlayer on the data storage structure, a protection insulating layer between a sidewall of the data storage structure and the first upper insulating interlayer and between the first lower insulating interlayer and the first upper insulating interlayer that are on the cell region and the peripheral circuit region, and a conductive pattern penetrating the first upper insulating interlayer, the protection insulating layer, and the first lower insulating interlayer that are on the peripheral circuit region. The conductive pattern may include a line part and contact parts. The line part may extend in a direction parallel to an upper surface of the substrate. The contact parts may extend from the line part toward the substrate and are laterally spaced apart from each other with an insulating pattern therebetween. The insulating pattern may include a portion of each of the first upper insulating interlayer, the protection insulating layer, and the first lower insulating interlayer. Each of the contact parts may have a width that increases as a distance from the substrate increases.

According to example embodiments of the inventive concepts, a semiconductor device may include a substrate, a first lower insulating interlayer on the substrate, a protection insulating layer on first lower insulating interlayer on the substrate, a first upper insulating interlayer on the protection insulating layer, and a conductive pattern including a first part and a plurality of second parts. The first part may be within the first upper insulating interlayer. The plurality of second parts may be respectively within the first upper insulating interlayer, the protection insulating layer, and the first lower insulating interlayer. The plurality of second parts may be spaced apart from each other in a first direction that is parallel to an upper surface of the substrate. At least a portion of a sidewall of at least one of the second parts comprises a stepped profile.

DETAILED DESCRIPTION

Various example embodiments of the inventive concepts will now be described more fully with reference to the accompanying drawings in which some example embodiments of the inventive concepts are shown. However, the inventive concepts may be embodied in many alternate forms and should not be construed as limited to only the example embodiments set forth herein.

Figure 1:
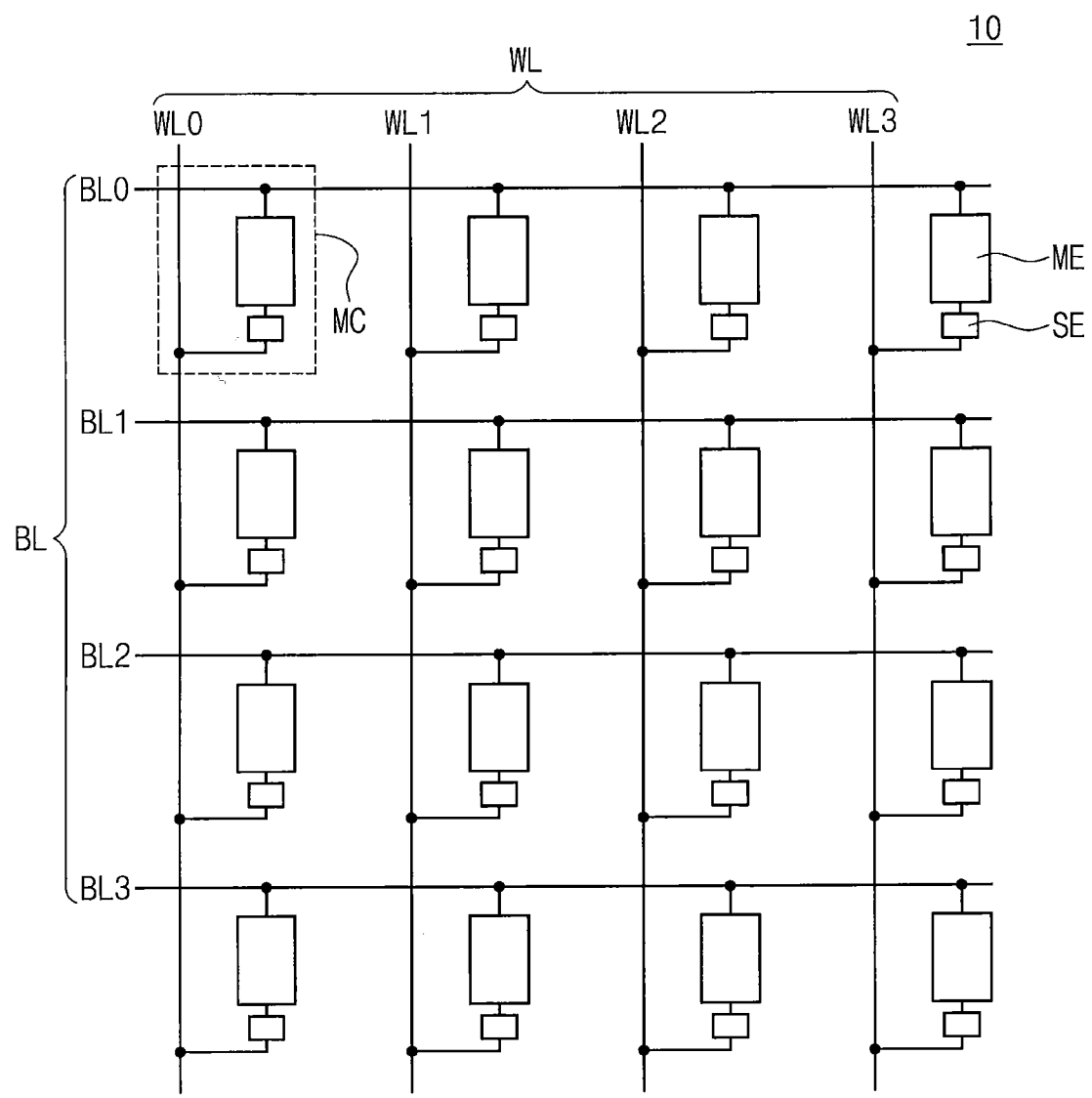
FIG. 1 is a circuit diagram of a memory cell array of a semiconductor device according to example embodiments of the inventive concepts.
Figure 2:
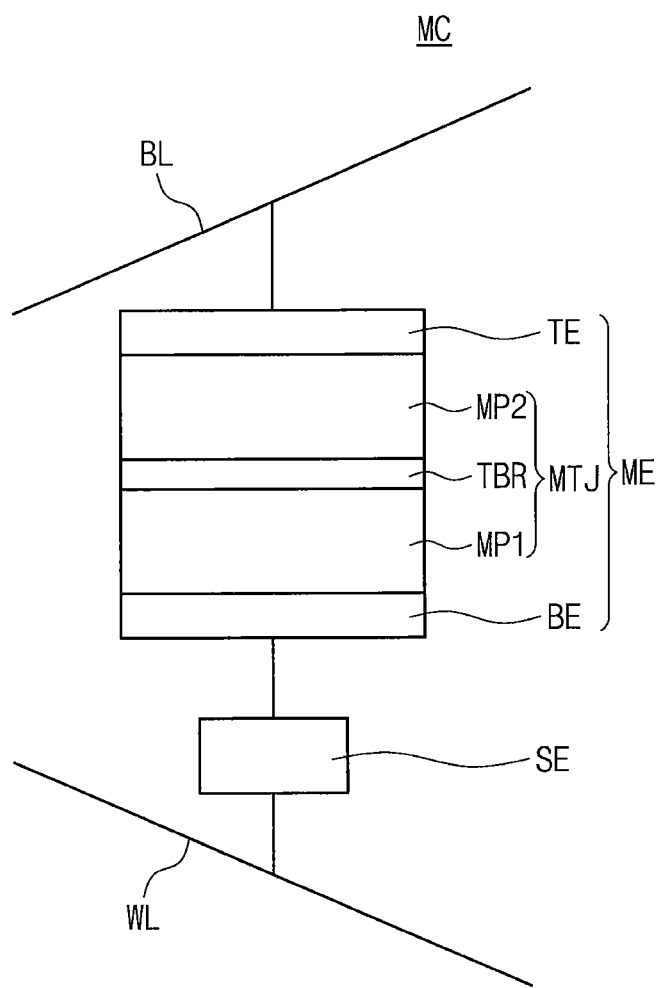
FIG. 2 is a circuit diagram of a unit memory cell of a semiconductor memory device according to example embodiments of the inventive concepts.

FIG. 1 is a circuit diagram of a memory cell array of a semiconductor device according to example embodiments of the inventive concepts. FIG. 2 is a circuit diagram of a unit memory cell of a semiconductor memory device according to example embodiments of the inventive concepts.

Referring to FIG. 1, a memory cell array 10 may include a plurality of word lines WL0-WL3, a plurality of bit lines BL0-BL3, and a plurality of unit memory cells MC. The unit memory cells MC may be two- or three-dimensionally arranged. The bit lines BL0-BL3 and the word lines WL0-WL3 may intersect each other. The unit memory cells MC may be connected to corresponding ones of the word lines WL0-WL3 and corresponding ones of the bit lines BL0-BL3. Each of the word lines WL0-WL3 may be connected to a plurality of the unit memory cells MC. The unit memory cells MC connected to one word line WL may be connected to the bit lines BL0-BL3. The unit memory cells MC connected to one bit line BL may be connected to the word lines WL0-WL3. The unit memory cells MC connected to one word line WL may be connected to a read circuit and/or a write circuit by the respective bit lines BL0-BL3.

Referring to FIGS. 1 and 2, each of the unit memory cells may include a memory element ME and a selection element SE. The memory element ME may be connected between the bit line BL and the selection element SE. The selection element SE may be connected between the memory element ME and the word line WL. The memory element ME may be a variable resistance element capable of switching between two resistance states by an electrical pulse applied to the memory element ME. As an example, the memory element ME may have a thin film structure in which an electrical resistance may be changed using a spin transfer by a current passing therethrough. The memory element ME may have a thin film structure configured to have a magnetoresistance characteristic. The memory element ME may include at least one ferromagnetic material and/or at least one antiferromagnetic material.

The selection element SE may be configured to selectively control a current passing through the memory element ME. The selection element SE may be, for example, one of a diode, a PNP bipolar transistor, an NPN bipolar transistor, an NMOS field effect transistor and a PMOS filed effect transistor. For example, when the selection element SE is a bipolar transistor or a MOS field effect transistor, which is a three terminal element, additional interconnection lines may be connected to the selection element SE.

The memory element ME may include a magnetic tunnel junction MTJ. The magnetic tunnel junction MTJ may include a first magnetic pattern MP1, a second magnetic pattern MP2, and a tunnel barrier pattern TBR between the first magnetic pattern MP1 and the second magnetic pattern MP2. The first and second magnetic patterns MP1 and MP2 may each include at least one magnetic layer formed of a magnetic material. The memory element ME may further include a bottom electrode BE between the magnetic tunnel junction MTJ and the selection element SE and a top electrode TE between the magnetic tunnel junction MTJ and the bit line BL.

Figure 3:
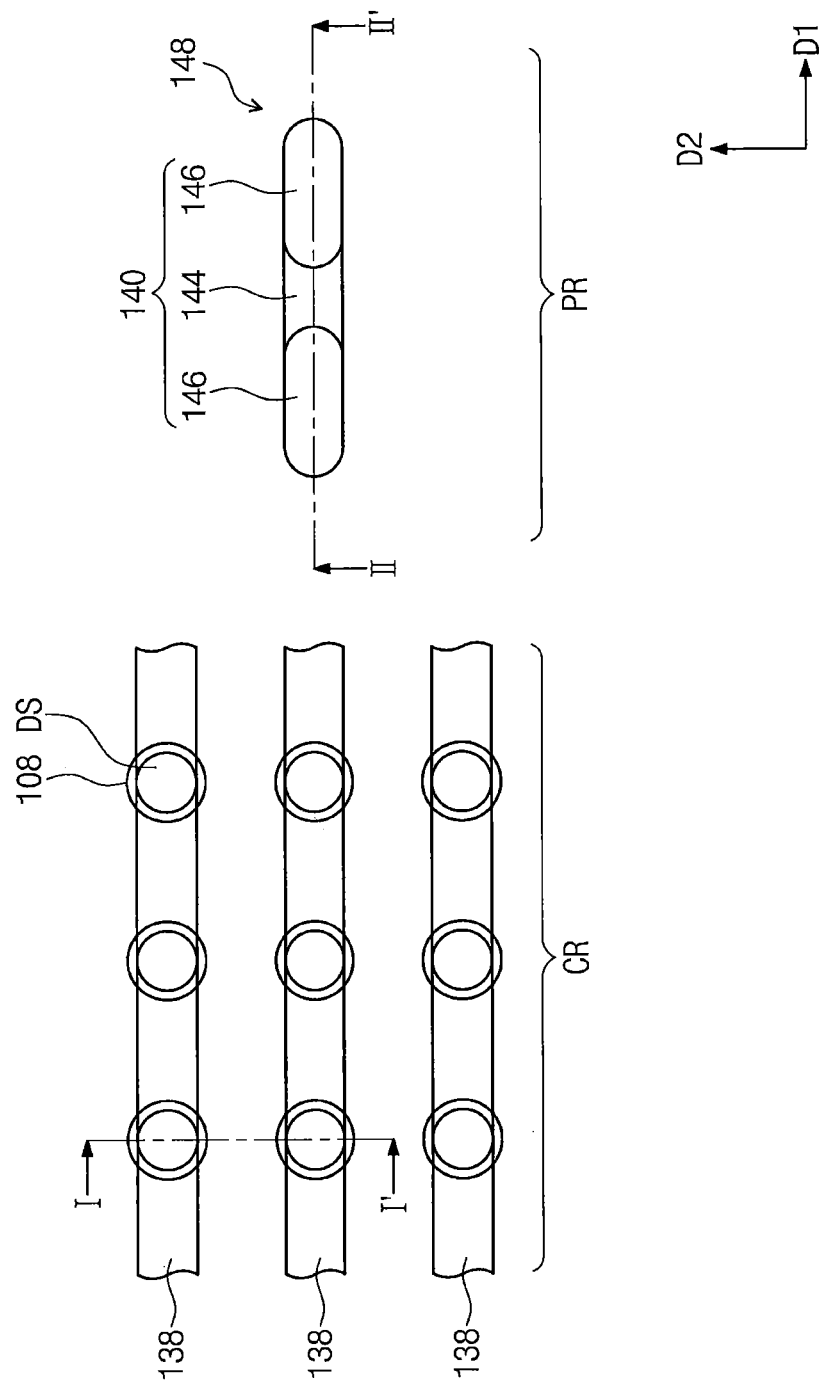
FIG. 3 is a plan view illustrating a semiconductor device according to example embodiments of the inventive concepts.
Figure 4:
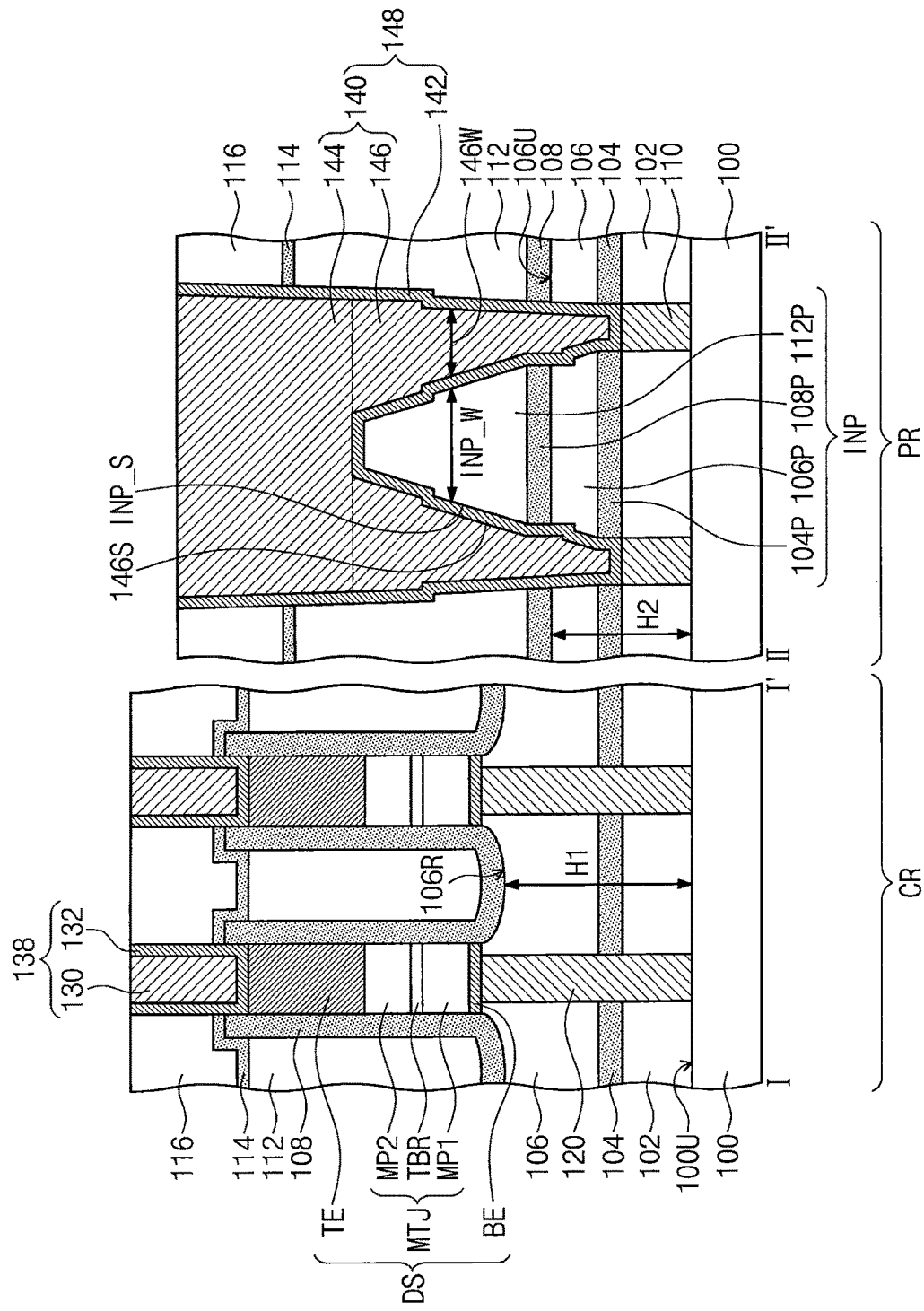
FIG. 4 is a cross-sectional view taken along lines I-I' and II-II' of FIG. 3.
Figure 5A:
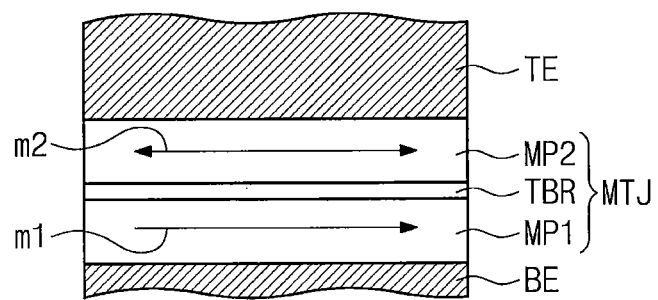
FIGS. 5A and 5B are cross-sectional views illustrating a magnetic tunnel junction of a semiconductor device according to example embodiments of the inventive concepts.
Figure 5B:
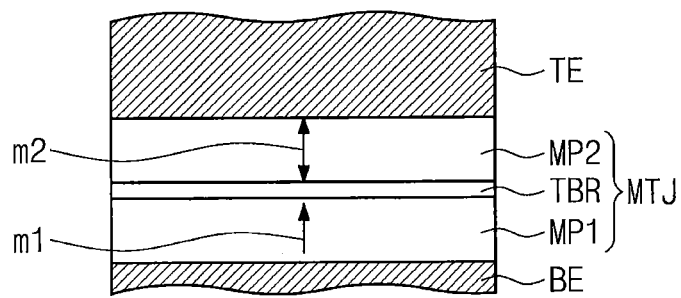

FIG. 3 is a plan view illustrating a semiconductor device according to example embodiments of the inventive concepts. FIG. 4 is a cross-sectional view taken along lines I-I' and II-II' of FIG. 3. FIGS. 5A and 5B are cross-sectional views illustrating a magnetic tunnel junction of a semiconductor device according to example embodiments of the inventive concepts.

Referring to FIGS. 3 and 4, a first lower insulating interlayer 106, a second lower insulating interlayer 102, and a lower insulating layer 104 may be disposed on a substrate 100. The second lower insulating interlayer 102 may be disposed between the substrate 100 and the first lower insulating interlayer 106. The lower insulating layer 104 may be disposed between the first lower insulating interlayer 106 and the second lower insulating interlayer 102. The substrate 100 may include a cell region CR and a peripheral circuit region PR. The cell region CR may be a region on which memory cells are provided. The peripheral circuit region PR may be a region on which peripheral circuits for driving the memory cells are provided. The first and second lower insulating interlayers 106 and 102 and the lower insulating layer 104 may be on and, in some embodiments, cover, the cell region CR and the peripheral circuit region PR.

The substrate 100 may be a semiconductor substrate including silicon (Si), silicon germanium (SiGe), germanium (Ge), or gallium arsenide (GaAs). The substrate 100 may be a silicon on insulator (SOI) substrate. The first lower insulating interlayer 106 and the second lower insulating interlayer 102 may include, for example, silicon oxide, silicon nitride, and/or silicon oxynitride. The lower insulating layer 104 may include a different material from the first and second lower insulating interlayers 106 and 102. The lower insulating layer 104 may include a material having an etching selectivity with respect to the first and second lower insulating interlayers 106 and 102. The lower insulating layer 104 may include nitride, e.g., silicon nitride.

Selection elements may be provided on the cell region CR. The selection elements may be field effect transistors and/or diodes. The second lower insulating interlayer 102 may be on and/or cover the selection elements. Peripheral conductive lines 110 may be disposed on a peripheral circuit region PR. The peripheral conductive lines 110 may penetrate the second lower insulating interlayer 102 to be electrically connected to the substrate 100. The peripheral conductive lines 110 may include doped semiconductor material (e.g., doped silicon), metal (e.g., tungsten, titanium, and/or tantalum), conductive metal nitride (e.g., titanium nitride, tantalum nitride, and/or tungsten nitride), and/or a metal-semiconductor compound (e.g., metal silicide).

Lower contact plugs 120 may be disposed on the cell region CR. The lower contact plugs 120 may penetrate the first lower insulating interlayer 106, the lower insulating layer 104, and the second lower insulating interlayer 102 and each may be connected to one terminal of a corresponding one of the selection elements. The lower contact plugs 120 may include doped semiconductor material (e.g., doped silicon), metal (e.g., tungsten, titanium, and/or tantalum), conductive metal nitride (e.g., titanium nitride, tantalum nitride, and/or tungsten nitride), and/or a metal-semiconductor compound (e.g., metal silicide).

Data storage structures DS, each of which is the memory element ME shown in FIG. 2, may be disposed on the cell region CR. The data storage structure DS may be two-dimensionally arranged along a first direction D1 and a second direction D2 crossing the first direction D1, in a plan view. The data storage structures DS may be disposed on the first lower insulating interlayer 106 and be connected to the lower contact plugs 120, respectively. Each of the data storage structures DS may include the magnetic tunnel junction MTJ, the bottom electrode BE between each of the lower contact plugs 120 and the magnetic tunnel junction MTJ, and the top electrode TE spaced apart from the bottom electrode BE with the magnetic tunnel junction MTJ therebetween. The magnetic tunnel junction MTJ may be disposed between the bottom electrode BE and the top electrode TE. The bottom electrode BE may be connected to the lower contact plugs 120, respectively. The bottom electrode BE may include conductive metal nitride (e.g., titanium nitride or tantalum nitride). The top electrode TE may include metal (e.g., tantalum, tungsten, ruthenium, or iridium) and/or conductive metal nitride (e.g., titanium nitride).

The magnetic tunnel junction MTJ may include the first magnetic pattern MP1, the second magnetic pattern MP2, and the tunnel barrier pattern TBR therebetween. The first magnetic pattern MP1 may be disposed between the bottom electrode BE and the tunnel barrier pattern TBR. The second magnetic pattern MP2 may be disposed between the top electrode TE and the tunnel barrier pattern TBR. The tunnel barrier pattern TBR may include, e.g., magnesium oxide, titanium oxide, aluminum oxide, magnesium zinc oxide, and/or magnesium boron oxide. Each of the first magnetic pattern MP1 and the second magnetic pattern MP2 may include at least one magnetic layer.

Referring to FIGS. 5A and 5B, the first magnetic pattern MP1 may include a reference layer having a magnetization direction m1 fixed in a direction. The second magnetic pattern MP2 may include a free layer having a magnetization direction m2 that is changeable to be parallel or antiparallel to the magnetization direction m1 of the reference layer. In FIGS. 5A and 5B, the first magnetic pattern MP1 may include the reference layer, and the second magnetic pattern MP2 may include the free layer, but the inventive concepts are not limited thereto. For example, the first magnetic pattern MP1 may include the free layer, and the second magnetic pattern MP2 may include the reference layer, In some embodiments, referring to FIG. 5A, the magnetization directions m1 and m2 may be substantially parallel to an interface between the first magnetic pattern MP1 and the magnetic barrier pattern TBR. In this case, the reference layer and the free layer may include a ferromagnetic material. The reference layer may further include an antiferromagnetic material for fixing a magnetization direction of the ferromagnetic material.

In some embodiments, referring to FIG. 5B, the magnetization directions m1 and m2 may be substantially vertical to an interface between the first magnetic pattern MP1 and the magnetic barrier pattern TBR. In this case, the reference layer and the free layer may include at least one of a vertical magnetic material (e.g., CoFeTb, CoFeGd, or CoFeDy), a vertical magnetic material having a L10 structure, CoPt of hexagonal close packed lattice structure, and/or a vertical magnetic structure. The vertical magnetic material having the L10 structure may include at least one of FePt of L10 structure, FePd of L10 structure, CoPd of L10 structure, and CoPt of L10 structure. The vertical magnetic structure may include ferromagnetic materials and antiferromagnetic materials that are repeatedly and alternately stacked. For example, the vertical magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the number of stacks. Here, the reference layer may be thicker than the free layer, and/or a coercive force of the reference layer may be greater than a coercive force of the free layer.

Referring again to FIGS. 3 and 4, a first portion of the first lower insulating interlayer 106 that is on the cell region CR may have an upper surface 106R recessed toward the substrate 100, between the data storage structures DS. The recessed upper surface 106R of the first portion of the first lower insulating interlayer 106 may be positioned at a first height H1 from the substrate 100. In some embodiments, the portion of the recessed upper surface 106R that is nearest the substrate 100 is a distance H1 from the substrate 100. An upper surface 106U of a second portion of the first lower insulating interlayer 106 that is on the peripheral circuit region PR may be positioned at a second height H2 from the substrate 100. The second height H2 may be smaller than the first height H1. The first and second heights H1 and H2 may each be a distance measured from an upper surface 100U of the substrate 100. The upper surface 106U of the second portion of the first lower insulating interlayer 106 that is on the peripheral circuit region PR may be positioned at a lower level from the substrate 100 than the recessed upper surface 106R of the first portion of the first lower insulating interlayer 106 that is on the cell region CR.

A protection insulating layer 108 may be disposed on sidewalls of the data storage structures DS. In plan view, the protection insulating layer 108 may surround the sidewalls of the data storage structures DS. The protection insulating layer 108 may be on and/or cover sidewalls of the bottom electrode BE, the magnetic tunnel junction MTJ, and the top electrode TE. In plan view, the protection insulating layer 108 may surround the sidewalls of the bottom electrode BE, the magnetic tunnel junction MTJ, and the top electrode TE. The protection insulating layer 108 may conformally cover the recessed upper surface 106R of the first portion of the first lower insulating interlayer 106 between the data storage structures DS and extend along and/or cover the upper surface 106U of the second portion of the first lower insulating interlayer 106 that is on the peripheral circuit region PR.

A first upper insulating interlayer 112 may be disposed on the first lower insulating interlayer 106 and may be on and/or cover the cell region CR and the peripheral circuit region PR. The first upper insulating interlayer 112 may be disposed on the first portion of the first lower insulating interlayer 106 and the data storage structures DS that are on the cell region CR and may be on the second portion of the first lower insulating interlayer 106 that is on the peripheral circuit region PR. The protection insulating layer 108 may be disposed between the sidewall of each of the data storage structures DS and the first upper insulating interlayer 112 and between the recessed upper surface 106R of the first portion of the first lower insulating interlayer 106 and the first upper insulating interlayer 112. The protection insulating layer 108 may extend between the upper surface 106U of the second portion of the first lower insulating interlayer 106 and the first upper insulating interlayer 112.

The first upper insulating interlayer 112 may include, for example, oxide, nitride, and/or oxynitride. The protection insulating layer 108 may include a different material from the first upper insulating interlayer 112 and the first lower insulating interlayer 106. The protection insulating layer 108 may include a material having an etching selectivity with respect to the first upper insulating interlayer 112 and the first lower insulating interlayer 106. The protection insulating layer 108 may include nitride, e.g., silicon nitride. The protection insulating layer 108 may include the same material as the lower insulating layer 104.

A second upper insulating interlayer 116 may be disposed on the first upper insulating interlayer 112. An upper insulating layer 114 may be disposed between the first upper insulating interlayer 112 and the second upper insulating interlayer 116. The upper insulating layer 114 and the second upper insulating interlayer 116 may be on and/or cover the cell region CR and the peripheral circuit region PR. The second upper insulating interlayer 116 may include, for example, oxide, nitride, and/or oxynitride. The upper insulating layer 114 may include a different material from the first and second upper insulating interlayers 112 and 116. The upper insulating layer 114 may include a material having an etching selectivity with respect to the first and second upper insulating interlayers 112 and 116. The upper insulating layer 114 may include nitride, e.g., silicon nitride. The upper insulating layer 114 may include the same material as the lower insulating layer 104.

Cell interconnection structures 138 may be disposed on the cell region CR. The cell interconnection structures 138 may extend in the first direction D1 and be spaced apart from each other in the second direction D2, in plan view. The cell interconnection structures 138 may penetrate the second upper insulating interlayer 116 and the upper insulating layer 114 to be connected to the data storage structures DS, respectively. Each of the cell interconnection structures 138 may be commonly connected to the data storage structures DS arranged in the first direction D1. Each of the cell interconnection structures 138 may include a cell conductive line 130 extending in the first direction D1 and a cell barrier pattern 132 extending along a lower surface and sidewalls of the cell conductive line 130. An upper surface of the cell conductive line 130 and an uppermost surface of the cell barrier pattern 132 may be substantially coplanar with an upper surface of the second upper insulating interlayer 116. The cell conductive line 130 may include metal, e.g., copper. The cell barrier pattern 132 may include conductive metal nitride.

A peripheral interconnection structure 148 may be disposed on the peripheral circuit region PR. The peripheral interconnection structure 148 may penetrate the second upper insulating interlayer 116, the upper insulating layer 114, the first upper insulating interlayer 112, the protection insulating layer 108, the first lower insulating interlayer 106, and the lower insulating layer 104 and be connected to the peripheral conductive lines 110. The peripheral interconnection structure 148 may include a conductive pattern 140 and a peripheral barrier pattern 142 extending along a lower surface and sidewalls of the conductive pattern 140. The conductive pattern 140 may penetrate the second upper insulating interlayer 116, the upper insulating layer 114, the first upper insulating interlayer 112, the protection insulating layer 108, the first lower insulating interlayer 106, and at least a portion of the lower insulating layer 104 that are on the peripheral circuit region PR.

The conductive pattern 140 may include a line part 144 extending in a direction, e.g., the first direction D1, parallel to the upper surface 100U of the substrate 100 and contact parts 146 extending from the line part 144 toward the substrate 100. The contact parts 146 may be laterally spaced apart from each other with an insulating pattern INP interposed therebetween. The contact parts 146 may be connected to the peripheral conductive lines 110, respectively. The line part 144 may be commonly connected to the contact parts 146. The line part 144 may penetrate the second upper insulating interlayer 116, the upper insulating layer 114, and an upper portion of the first upper insulating interlayer 112 that are on the peripheral circuit region PR. The contact parts 146 may penetrate a lower portion of the first upper insulating interlayer 112, the protection insulating layer 108, the first lower insulating interlayer 106, and/or the at least a portion of the lower insulating layer 104. The insulating pattern INP may include a portion 112P of the first upper insulating interlayer 112, a portion 108P of the protection insulating layer 108, a portion 106P of the first lower insulating interlayer 106, and/or a portion of the lower insulating layer 104 that are interposed between the contact parts 146.

The peripheral barrier pattern 142 may be interposed between the line part 144 and the insulating pattern INP and may extend between each of the contact parts 146 and the insulating pattern INP and between each of the peripheral conductive lines 110 and each of the contact parts 146. The peripheral barrier pattern 142 may be interposed between each of the contact parts 146 and the lower insulating layer 104, between each of the contact parts 146 and the first lower insulating interlayer 106, between each of the contact parts 146 and the protection insulating layer 108, and between each of the contact parts 146 and the first upper insulating interlayer 112. The peripheral barrier pattern 142 may extend between the line part 144 and the first upper insulating interlayer 112, between the line part 144 and the upper insulating layer 114, and between the line part 144 and the second upper insulating interlayer 116. The line part 144 and the contact parts 146 may be integrally coupled to each other without an interface therebetween.

Each of the contact parts 146 may have a width 146W in the direction parallel to the upper surface 100U of the substrate 100, e.g., the first direction D1. The width 146W of the contact parts 146 may increase as a distance from the substrate 100 increases. In some embodiments, the contact parts 146 may have a width 146W that is tapered toward the substrate 100. The insulating pattern INP may have a width INP_W in the direction parallel to the upper surface 100U of the substrate 100, e.g., the first direction D1. The width INP_W of the insulating pattern INP may decrease as a distance from the substrate 100 increases. In some embodiments, the insulating pattern INP may have a width INP_W that is tapered away from the substrate 100.

In cross-sectional view, the insulating pattern INP may have opposite sidewalls INP_S. Each of the sidewalls INP_S of the insulating pattern INP may face a sidewall 146S of each of the contact parts 146. The peripheral barrier pattern 142 may be interposed between each of the sidewalls INP_S of the insulating pattern INP and the sidewall 146S of each of the contact parts 146. The sidewalls INP_S of the insulating pattern INP may be sloped with respect to the upper surface 100U of the substrate 100. At least a portion of each of the sidewalls INP_S of the insulating pattern INP may have a stepped profile. For example, a sidewall of the portion 112P of the first upper insulating interlayer 112 that is interposed between the contact parts 146 may have a stepped profile. In some embodiments, a sidewall of the portion 106P of the first lower insulating interlayer 106 that is interposed between the contact parts 146 may have a stepped profile. The sidewalls 146S of the contact parts 146 may have shapes corresponding to the shapes of the respective sidewalls INP_S of the insulating pattern INP. The sidewalls 146S of the contact parts 146 may be sloped with respect to the upper surface 100U of the substrate 100. At least a portion of each of the sidewalls 146S of the contact parts 146 may have a stepped profile.

An upper surface of the conductive pattern 140, i.e., an upper surface of the line part 144, and an uppermost surface of the peripheral barrier pattern 142 may be substantially coplanar with the upper surface of the second upper insulating interlayer 116. The line part 144 and the contact parts 146 may include a same material. The line part 144 and the contact parts 146 may have the same material as the cell conductive line 130. The line part 144 and the contact parts 146 may include metal, e.g., copper. The peripheral barrier pattern 142 may include the same material as the cell barrier pattern 132. The peripheral barrier pattern 142 may include conductive metal nitride.

FIGS. 6 to 11 illustrate a method of manufacturing a semiconductor memory device according to example embodiments of the inventive concepts, and are cross-sectional views taken along lines I-I', II-II' of FIG. 3. The same reference numerals are used to denote the same elements as shown in FIGS. 3, 4, 5A and 5B, and repeated descriptions thereof are omitted for brevity.

Figure 6:
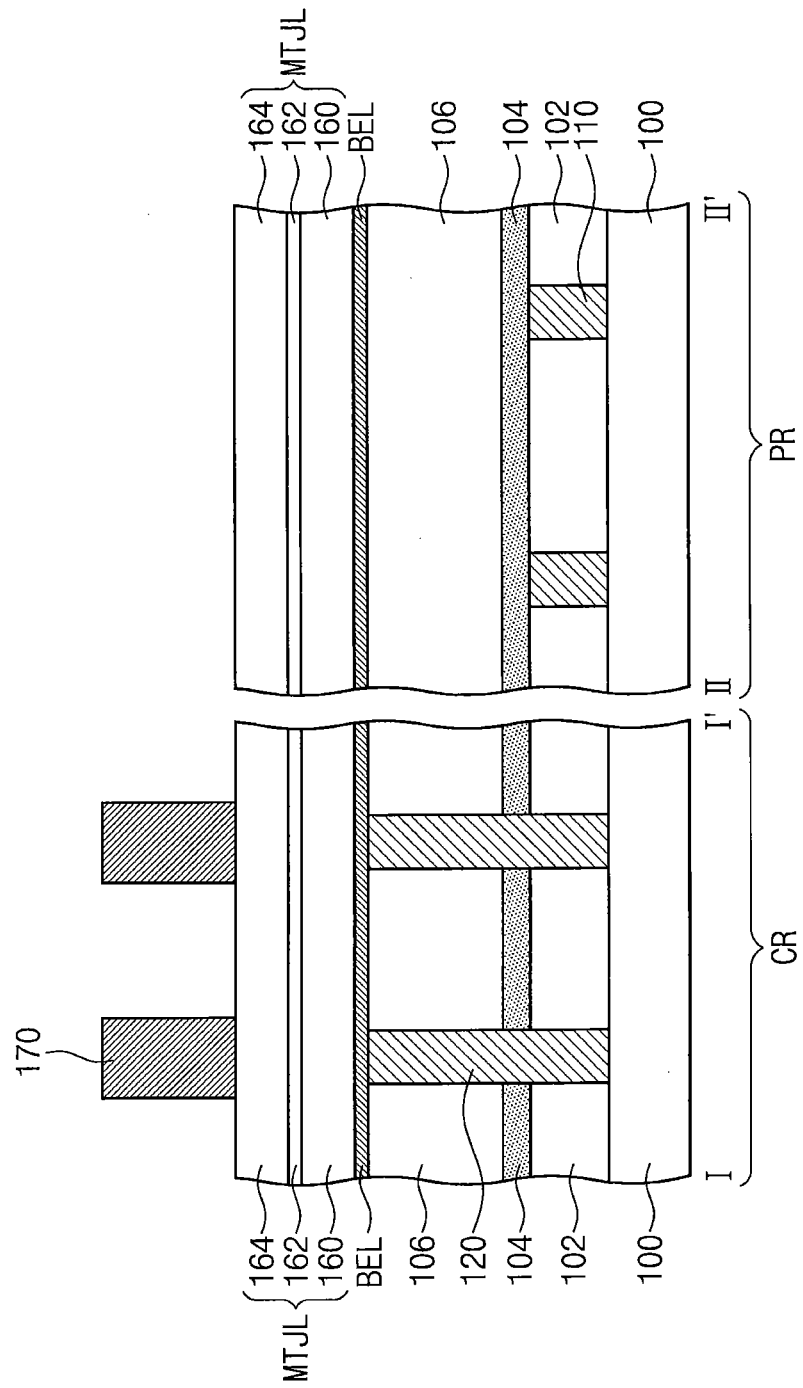
FIGS. 6 to 11 illustrate a method of manufacturing a semiconductor memory device according to example embodiments of the inventive concepts, and are cross-sectional views taken along lines I-I', II-II' of FIG. 3.

Referring to FIG. 6, the substrate 100 is provided. The substrate 100 may include the cell region CR and the peripheral circuit region PR. The second lower insulating interlayer 102, the lower insulating layer 104, and the first lower insulating interlayer 106 are formed on the substrate 100. The first lower insulating interlayer 106, the second lower insulating interlayer 102, and the lower insulating layer 104 may be on and/or cover the cell region CR and the peripheral circuit region PR. The selection elements may be formed on the cell region CR. The second lower insulating interlayer 102 may cover the selection elements.

The peripheral conductive lines 110 may be formed on the peripheral circuit region PR. The peripheral conductive lines 110 may penetrate the second lower insulating interlayer 102 to be electrically connected to the substrate 100. Upper surfaces of the peripheral conductive lines 110 may be substantially coplanar with an upper surface of the second lower insulating interlayer 102. The lower insulating layer 104 and the first lower insulating interlayer 106 may be sequentially formed on the second lower insulating interlayer 102 and cover the upper surfaces of the peripheral conductive lines 110. The lower insulating layer 104 may be formed between the first lower insulating interlayer 106 and the second lower insulating interlayer 102.

The lower contact plugs 120 may be formed on the cell region CR. The lower contact plugs 120 may penetrate the first lower insulating interlayer 106, the lower insulating layer 104, and the second lower insulating interlayer 102, and each of the lower contact plugs 120 may be connected to one terminal of a corresponding one of the selection elements. Upper surfaces of the lower contact plugs 120 may be substantially coplanar with the first lower insulating interlayer 106.

A bottom electrode layer BEL and a magnetic tunnel junction layer MTJL may be sequentially formed on the first lower insulating interlayer 106. The bottom electrode layer BEL and the magnetic tunnel junction layer MTJL may cover the cell region CR and the peripheral circuit region PR. The bottom electrode layer BEL may include conductive metal nitride, e.g., titanium nitride and/or tantalum nitride. The bottom electrode BEL may be formed by a sputtering process, a chemical vapor deposition process, or an atomic layer deposition process. The magnetic tunnel junction layer MTJL may include a first magnetic layer 160, a tunnel barrier layer 162, and a second magnetic layer 164 that are sequentially stacked on the bottom electrode layer BEL. Each of the first magnetic layer 160 and the second magnetic layer 164 may include at least one magnetic layer. One of the first and second magnetic layers 160 and 164 may include a reference layer having a magnetization direction fixed in a direction. The other one of the first and second magnetic layers 160 and 164 may include a free layer having a changeable magnetization direction. A material forming the reference layer and the free layer may be the same as that described with reference to FIGS. 5A and 5B. The tunnel barrier layer 162 may include, e.g., magnesium oxide, titanium oxide, aluminum oxide, magnesium zinc oxide and/or magnesium boron oxide. The first magnetic layer 160, the tunnel barrier layer 162, and the second magnetic layer 164 may be formed by a sputtering process, a chemical vapor deposition process, or an atomic layer deposition process.

Conductive mask patterns 170 may be formed on the magnetic tunnel junction layer MTJL on the cell region CR. The conductive mask patterns 170 may define a region in which the magnetic tunnel junctions described later are to be formed. The conductive mask patterns 170 may include metal, e.g., tantalum, tungsten, ruthenium, or iridium, and/or conductive metal nitride, e.g., titanium nitride.

Figure 7:
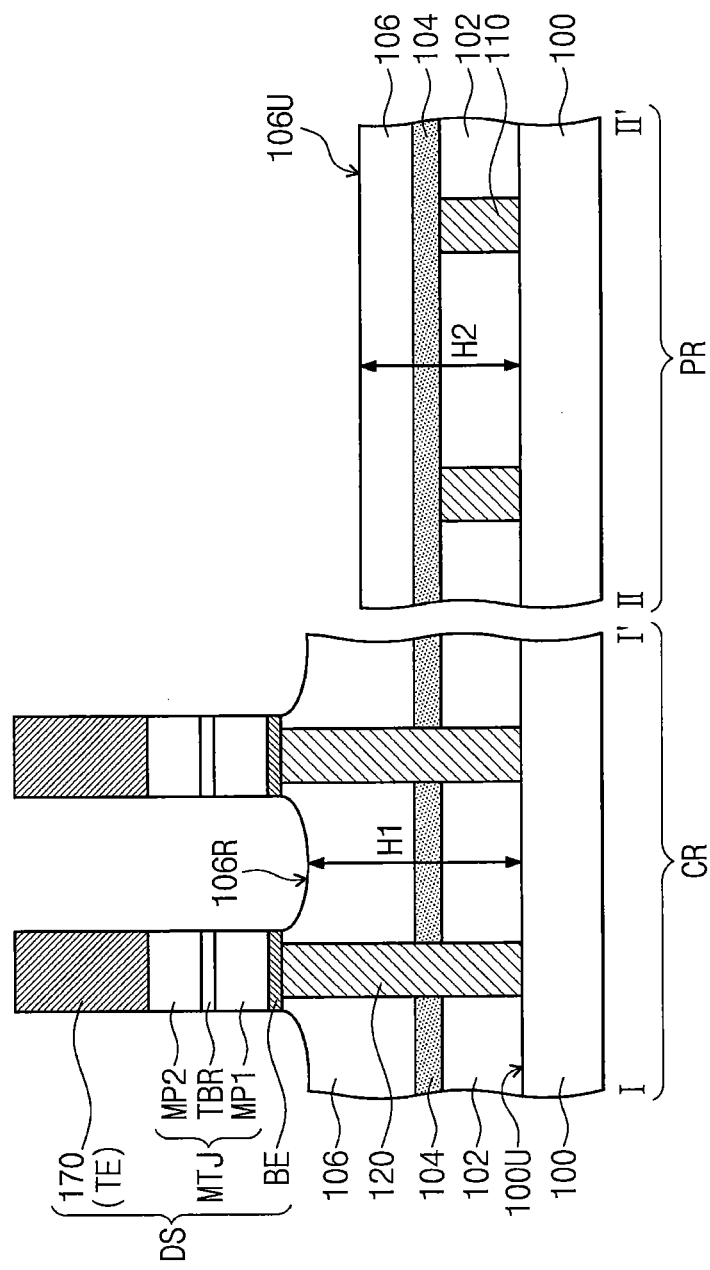

Referring to FIG. 7, the magnetic tunnel junction layer MTJL and the bottom electrode layer BEL may be sequentially etched using the conductive mask patterns 170 as an etch mask, thus forming the magnetic tunnel junctions MTJ and the bottom electrodes BE on the first lower insulating interlayer 106 on the cell region CR. The bottom electrodes BE may be connected to the lower contact plugs 120, respectively. The magnetic tunnel junctions MTJ may be formed on the bottom electrodes BE, respectively. Each of the magnetic tunnel junctions MTJ may include the first magnetic pattern MP1, the tunnel barrier pattern TBR, and the second magnetic pattern MP2 that are sequentially stacked on the respective bottom electrodes BE. The first magnetic pattern MP1 and the second magnetic pattern MP2 may be spaced apart from each other with the tunnel barrier pattern TBR therebetween. The etching of the magnetic tunnel junction layer MTJL may include sequentially etching the second magnetic layer 164, the tunnel barrier layer 162, and the first magnetic layer 160 using the conductive mask patterns 170 as an etch mask. The second magnetic layer 164, the tunnel barrier layer 162, and the first magnetic layer 160 may be etched, thus forming the second magnetic pattern MP2, the tunnel barrier pattern TBR, and the first magnetic pattern MP1.

The process of etching the magnetic tunnel junction layer MTJL and the bottom electrode layer BEL may be, e.g., an ion beam etching process using an ion beam. The ion beam may include inactive ions. By the above etching process, an upper portion of the first lower insulating interlayer 106 between the magnetic tunnel junctions MTJ may be recessed. Thus, a first portion of the first lower insulating interlayer 106 that is on the cell region CR may have the upper surface 106R recessed toward the substrate 100, between the magnetic tunnel junctions MTJ. The recessed upper surface 106R of the first portion of the first lower insulating interlayer 106 may be positioned at the first height H1 from the substrate 100. In addition, by the above etching process, an upper portion of a second part of the first lower insulating interlayer 106 that is on the peripheral circuit region PR may be etched. The upper surface 106U of the second part of the first lower insulating interlayer 106 that is on the peripheral circuit region PR may be positioned at the second height H2 from the substrate 100. The second height H2 may be smaller than the first height H1. The upper surface 106U of the second part of the first lower insulating interlayer 106 may be positioned at a lower level (e.g., closer to the substrate 100) than the recessed upper surface 106R of the first part of the first lower insulating interlayer 106 with respect to the upper surface 100U of the substrate 100.

After the above etching process, at least a portion of the respective conductive mask patterns 170 may remain on the respective magnetic tunnel junctions MTJ. Each of the remaining conductive mask patterns 170 may function as the top electrode TE. Hereinafter, the conductive mask patterns 170 refer to the top electrodes TE. Each of the top electrodes TE, each of the magnetic tunnel junctions MTJ, and each of the bottom electrodes BE may constitute the data storage structure DS.

Figure 8:
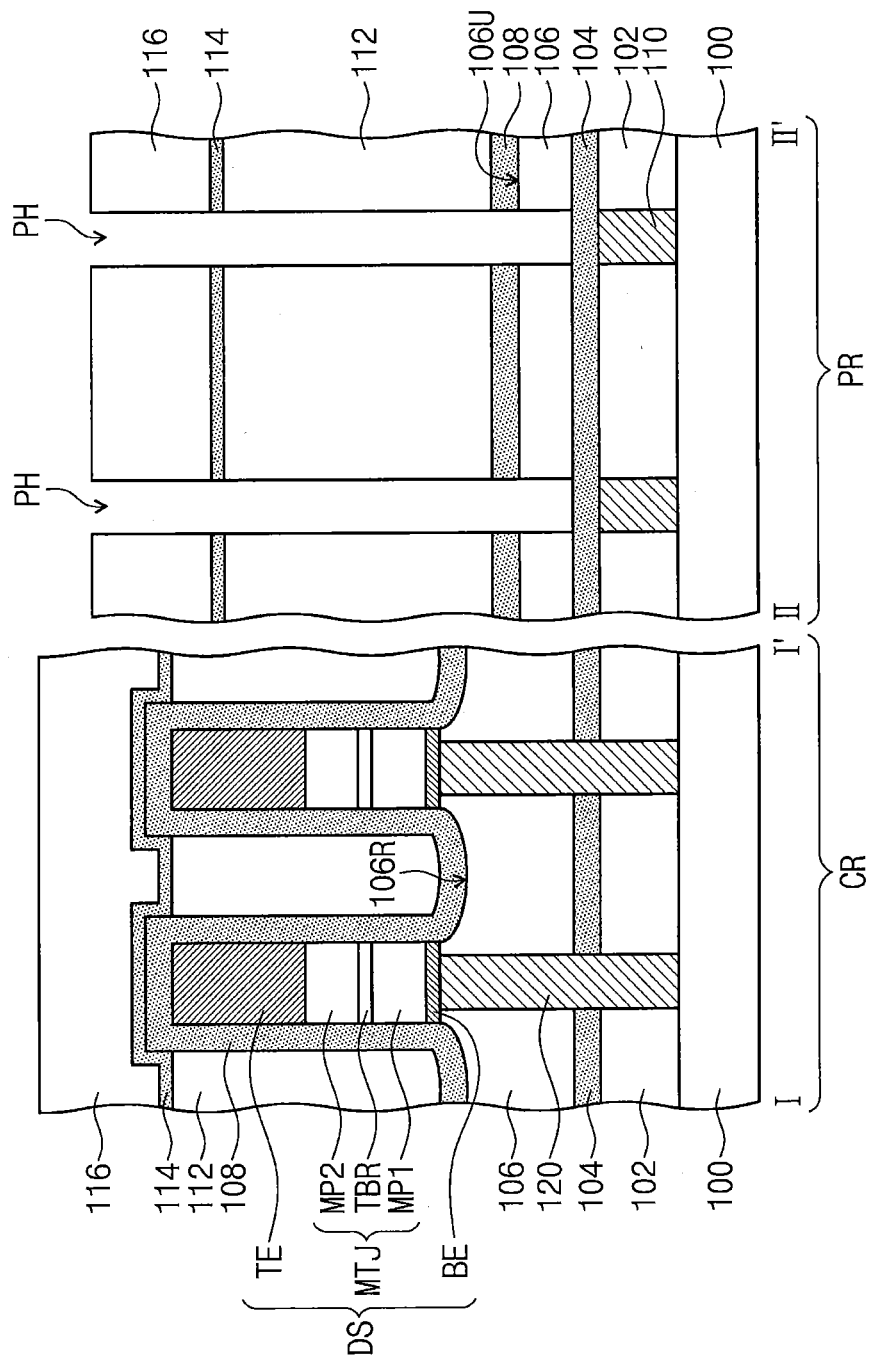

Referring to FIG. 8, the protection insulating layer 108 may be formed on the first lower insulating interlayer 106, and the protection insulating layer 108 may be on and/or cover the data storage structures DS. The protection insulating layer 108 may be conformally on upper surfaces and sidewalls of the data storage structures DS and extend along the recessed upper surface 106R of the first portion of the first lower insulating interlayer 106 between the data storage structures DS. The protection insulating layer 108 may extend along and/or cover the upper surface 106U of the second part of the first lower insulating interlayer 106 on the peripheral circuit region PR.

The first upper insulating interlayer 112 may be formed on the protection insulating layer 108, and may be within and/or fill a space between the data storage structures DS. The first upper insulating interlayer 112 may be on and/or cover the protection insulating layer 108 on the peripheral circuit region PR. The upper insulating layer 114 and the second upper insulating interlayer 116 may be sequentially formed on the first upper insulating interlayer 112. The upper insulating layer 114 may be interposed between the first upper insulating interlayer 112 and the second upper insulating interlayer 116. The upper insulating layer 114 and the second upper insulating interlayer 116 may be on and/or cover the cell region CR and the peripheral circuit region PR. The first and second lower insulating interlayers 106 and 102, the first and second upper insulating interlayers 112 and 116, the lower insulating layer 104, the protection insulating layer 108, and the upper insulating layer 114 may be formed by a chemical vapor deposition process, a physical vapor deposition, or an atomic layer deposition process.

Preliminary holes PH may be formed on the peripheral circuit region PR. The peripheral holes PH may penetrate the second upper insulating interlayer 116, the upper insulating layer 114, the first upper insulating interlayer 112, the protection insulating layer 108, and the first lower insulating interlayer 106, thus exposing an upper surface of the lower insulating layer 104. The formation of the preliminary holes PH may include forming a mask pattern on the second upper insulating interlayer 116, which includes openings defining a region in which the preliminary holes PH are to be formed, and sequentially etching the second upper insulating interlayer 116, the upper insulating layer 114, the first upper insulating interlayer 112, the protection insulating layer 108, and the first lower insulating interlayer 106. The mask pattern may be removed.

Figure 9:
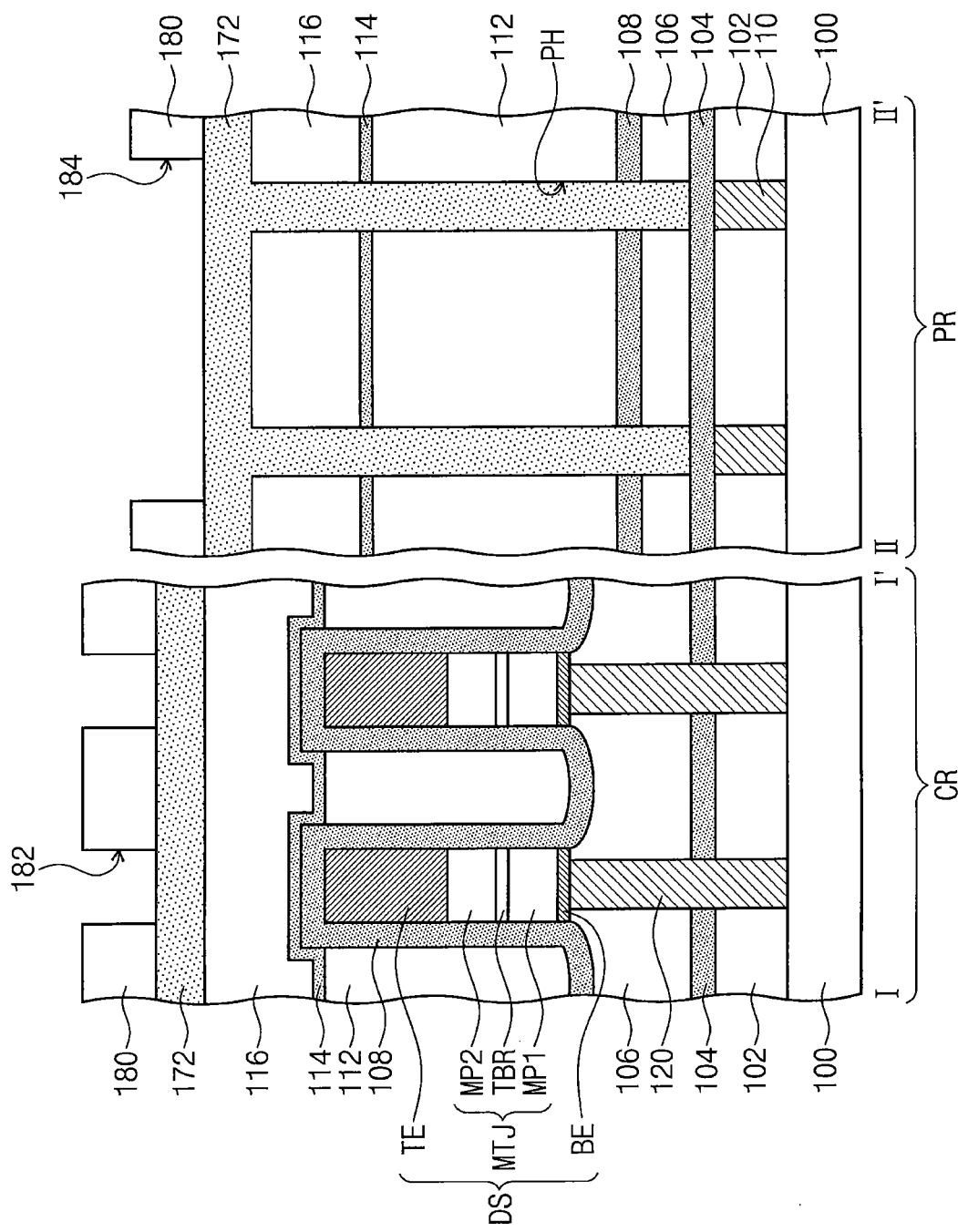

Referring to FIG. 9, a sacrificial layer 172 may be formed on the second upper insulating interlayer 116 and may be within and, in some embodiments, fill the preliminary holes PH. The sacrificial layer 172 may be on and/or cover the second upper insulating interlayer 116 on the cell region CR and the peripheral circuit region PR. The sacrificial layer 172 may include, e.g., a carbon-containing material.

A mask layer 180 may be formed on the sacrificial layer 172. The mask layer 180 may include a cell opening 182 exposing an upper surface of the sacrificial layer 172 on the cell region CR and a peripheral opening 184 exposing the upper surface of the sacrificial layer 172 on the peripheral circuit region PR. The cell opening 182 may define a region in which a cell interconnection structure 138 to be described later is to be formed. The peripheral opening 184 may define a region in which a peripheral interconnection structure to be described later is to be formed. The peripheral opening 184 may overlap the preliminary holes PH in plan view. The mask layer 180 may include a material having an etching selectivity with respect to the sacrificial layer 172, the first and second upper insulating interlayers 112 and 116, the upper insulating layer 114, the protection insulating layer 108, the first lower insulating interlayer 106, and the lower insulating layer 104. The mask layer 180 may include photoresist or at least one of oxide, nitride, and oxynitride.

Figure 10:
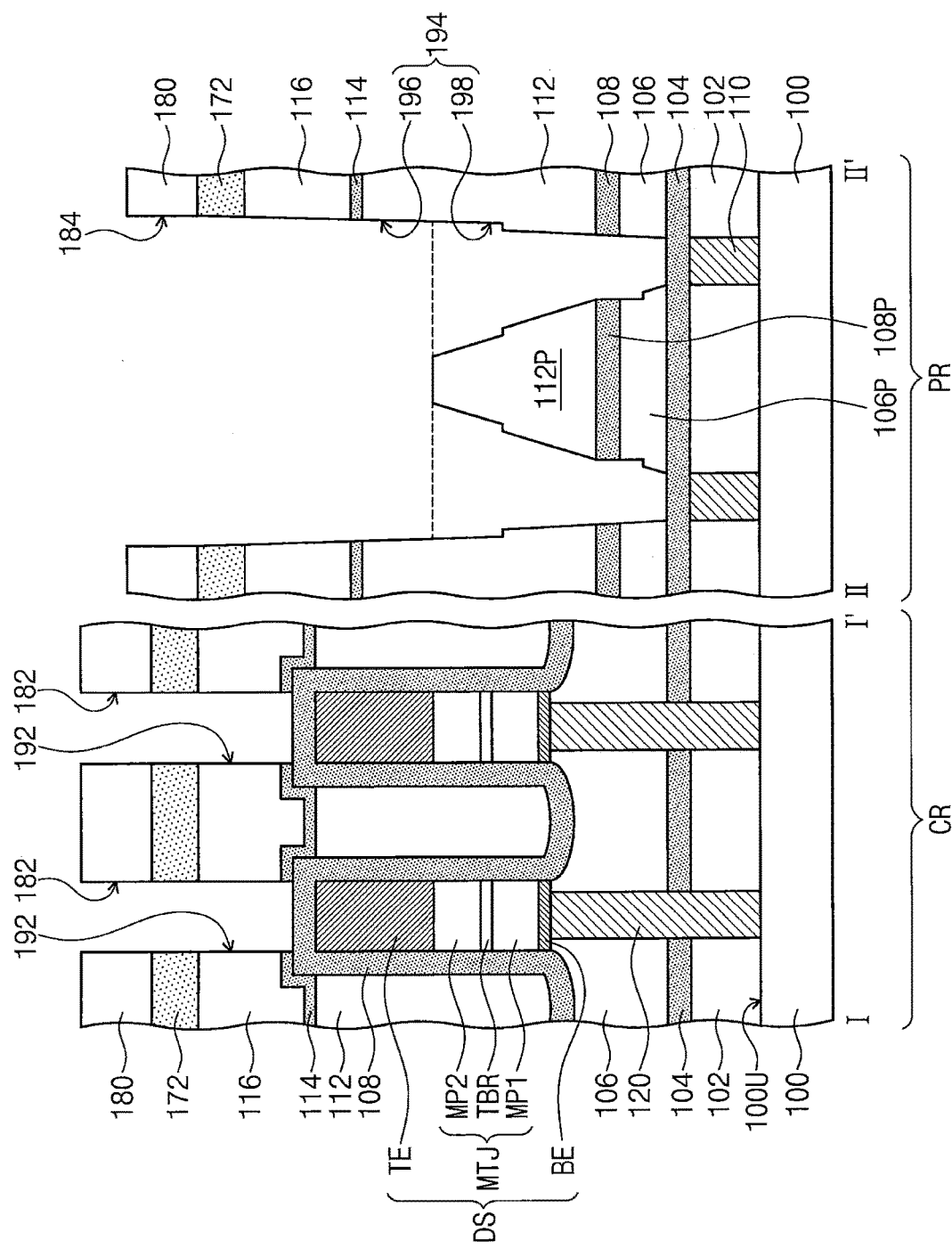

Referring to FIG. 10, a first etching process may be performed using the mask layer 180 as an etch mask. The sacrificial layer 172 and the second upper insulating interlayer 116 that are on the cell region CR may be patterned by the first etching process, thus forming a cell trench 192 in the second upper insulating interlayer 116. The upper insulating layer 114 on the cell region CR may be patterned by the first etching process. Thus, the cell trench 192 may extend into the upper insulating layer 114. The first etching process may be performed until the protection insulating layer 108 on the cell region CR is exposed. Thus, the cell trench 192 may expose an upper surface of the protection insulating layer 108 on the cell region CR. The cell trench 192 may extend in the direction parallel to the upper surface 100U of the substrate 100, e.g., the first direction D1.

On the peripheral circuit region PR, the sacrificial layer 172, the second upper insulating interlayer 116, the upper insulating layer 114, the first upper insulating interlayer 112, the protection insulating layer 108, and the first lower insulating interlayer 106 may be patterned by the first etching process, thus forming a through hole 194 penetrating the second upper insulating interlayer 116, the upper insulating layer 114, the first upper insulating interlayer 112, the protection insulating layer 108, and the first lower insulating interlayer 106 which are on the peripheral circuit region PR. The through hole 194 may include a peripheral trench 196 extending in the direction parallel to the upper surface 100U of the substrate 100 (e.g., the first direction D1) and contact holes 198 extending from the peripheral trench 196 toward the substrate 100. The contact holes 198 may be laterally spaced apart from each other. The peripheral trench 196 may be commonly connected to the contact holes 198. The peripheral trench 196 may penetrate the second upper insulating interlayer 116, the upper insulating layer 114, and an upper portion of the first upper insulating interlayer 112. The contact holes 198 may penetrate a lower portion of the first upper insulating interlayer 112, the protection insulating layer 108, and the first lower insulating interlayer 106. The first etching process may be performed until exposing the lower insulating layer 104 on the peripheral circuit region PR. Thus, the contact holes 198 may expose the upper surface of the lower insulating layer 104.

Referring to FIGS. 9 and 10, during the first etching process, an etch rate of the sacrificial layer 172 may be greater than an etch rate of each of the second upper insulating interlayer 116, the upper insulating layer 114, the first upper insulating interlayer 112, the protection insulating layer 108, and the first lower insulating interlayer 106. As the sacrificial layer 172 is etched by the first etching process, an upper surface of the second upper insulating interlayer 116 on the cell region CR and the peripheral circuit region PR may be exposed during the first etching process. In addition, as the sacrificial layer 172 filling the preliminary holes PH is etched by the first etching process, sidewalls of the second upper insulating interlayer 116, the upper insulating layer 114, the first upper insulating interlayer 112, the protection insulating layer 108, and the first lower insulating interlayer 106 that are on the peripheral circuit region PR may be exposed during the first etching process. The second upper insulating interlayer 116 which is on the cell region CR may be limitedly exposed to an etchant during the first etching process, whereas the upper surface of the second upper insulating interlayer 116 and the sidewalls of the second upper insulating interlayer 116, the upper insulating layer 114, the first upper insulating interlayer 112, the protection insulating layer 108, and the first lower insulating interlayer 106 that are on the peripheral circuit region PR may be sufficiently exposed to the etchant during the first etching process. In this case, while the second upper insulating interlayer 116 and the upper insulating layer 114 which are on the cell region CR are etched by the first etching process, the second upper insulating interlayer 116, the upper insulating layer 114, the first upper insulating interlayer 112, the protection insulating layer 108, and the first lower insulating interlayer 106 which are on the peripheral circuit region PR may be etched by the first etching process. Thus, the cell trench 192 on the cell region CR and the through hole 194 on the peripheral circuit region PR may be formed at the same time by the first etching process.

On the peripheral circuit region PR, the portion 112P of the first upper insulating interlayer 112, the portion 108P of the protection insulating layer 108, the portion 106P of the first lower insulating interlayer 106 may not be etched by the first etching process and remain between the contact holes 198. During the first etching process, the etch rate of the upper insulating layer 114 may be less than the etch rate of the first upper insulating interlayer 112. In this case, during the first etching process, at least a portion of the first upper insulating interlayer 112 on the peripheral circuit region PR may be more rapidly etched at a side portion thereof than at an upper portion thereof. Thus, a sidewall of the portion 112P of the first upper insulating interlayer 112 may have a stepped profile. During the first etching process, an etch rate of the protection insulating layer 108 may be less than an etch rate of the first lower insulating interlayer 106. In this case, during the first etching process, at least a portion of the first lower insulating interlayer 106 on the peripheral circuit region PR may be more rapidly etched at a side portion thereof than at an upper portion thereof. Thus, a sidewall of the portion 106P of the first lower insulating interlayer 106 may have a stepped profile.

Figure 11:
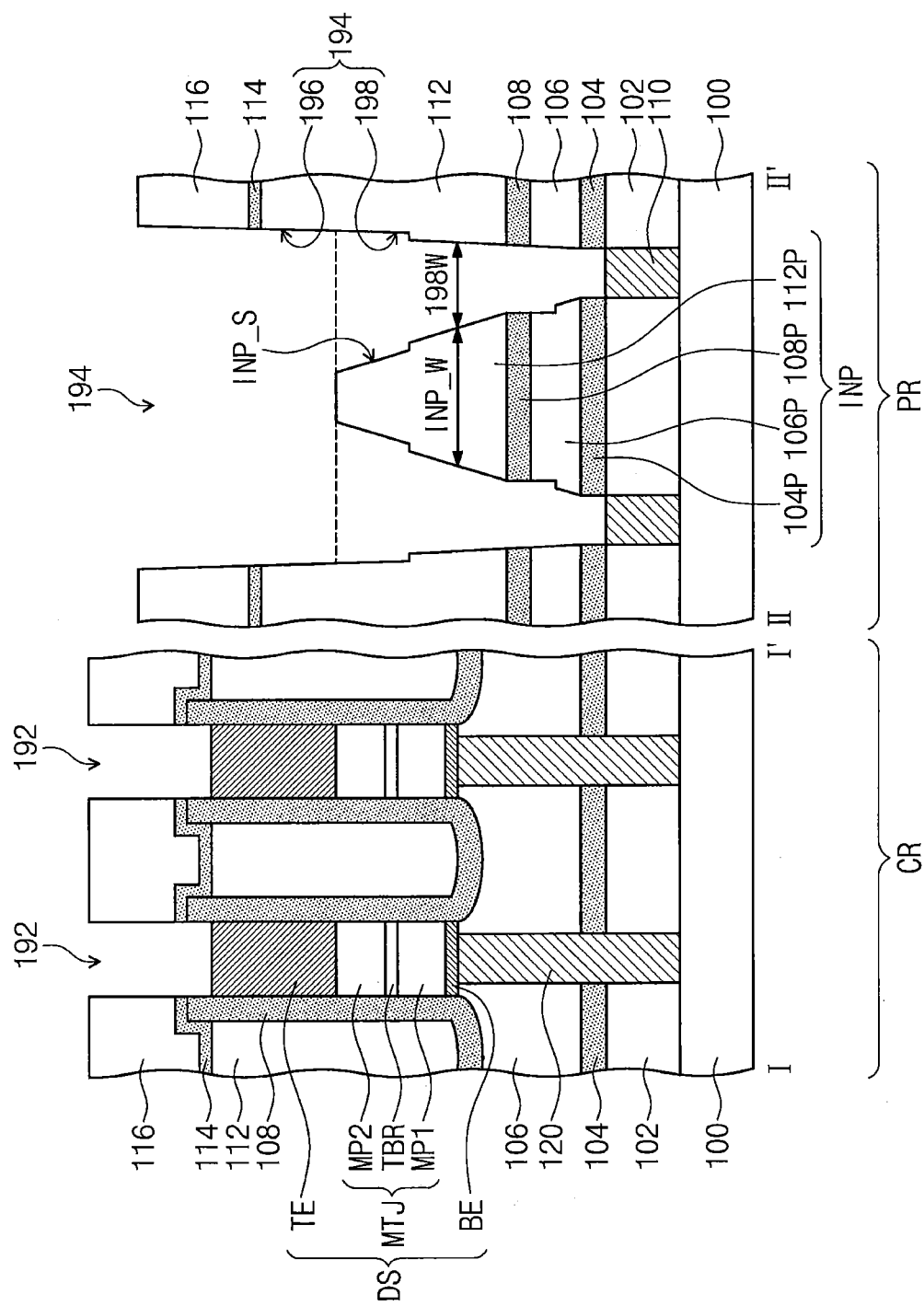

Referring to FIG. 11, a second etching process may be performed using the mask layer 180 as an etch mask. A portion of the protection insulating layer 108 exposed by the cell trench 192 and a portion of the lower insulating layer 104 exposed by the contact holes 198 may be etched by the second etching process. Thus, the cell trench 192 may extend into the protection insulating layer 108 and expose the top electrode TE. The contact holes 198 may extend into the lower insulating layer 104 and expose the peripheral conductive lines 110, respectively. The mask layer 180 and a residue of the sacrificial layer 172 may be removed. The mask layer 180 and the residue of the sacrificial layer 172 may be removed by, e.g., an ashing and/or strip process.

On the peripheral circuit region PR, the portion 104P of the lower insulating layer 104 may not be etched by the second etching process and remain between the contact holes 198. The portion 112P of the first upper insulating interlayer 112, the portion 108P of the protection insulating layer 108, the portion 106P of the first lower insulating interlayer 106, and the portion 104P of the lower insulating layer 104 refer to the insulating pattern INP. The insulating pattern INP may have the width INP_W in the direction parallel to the upper surface 100U of the substrate 100, e.g., the first direction D1. The width INP_W of the insulating pattern INP may decrease as a distance from the substrate 100 increases. The sidewall INP_S of the insulating pattern INP may be sloped with respect to the upper surface 100U of the substrate 100. At least a portion of the sidewall INP_S of the insulating pattern INP may have a stepped profile. The sidewall INP_S of the insulating pattern INP may correspond to an inner sidewall of each of the contact holes 198. Each of the contact holes 198 may have a width 198W in the direction parallel to the upper surface 100U of the substrate 100, e.g., the first direction D1. The width 198W of each of the contact holes 198 may increase as a distance from the substrate 100 increases.

Referring to FIGS. 3 and 4, the cell interconnection structure 138 may be formed in the cell trench 192 (see FIG. 11) on the cell region CR. The peripheral interconnection structure 148 may be formed in the through hole 194 (see FIG. 11) on the peripheral circuit region PR. The cell interconnection structure 138 may include the cell conductive line 130 extending in the first direction D1 and the cell barrier pattern 132 extending along a lower surface and sidewalls of the cell conductive line 130. The peripheral interconnection structure 148 may include the conductive pattern 140 and the peripheral barrier pattern 142 extending along a lower surface and sidewalls of the conductive pattern 140. The conductive pattern 140 may include the line part 144 formed in the peripheral trench 196 (see FIG. 11) and the contact parts 146 formed in the respective contact holes 198 (see FIG. 11). The contact parts 146 may be laterally spaced apart from each other with the insulating pattern INP therebetween.

The formation of the cell interconnection structure 138 and the peripheral interconnection structure 148 may include forming a barrier layer on the second upper insulating interlayer 116 to fill a portion of the cell trench 192 (see FIG. 11) and a portion of the through hole 194 (see FIG. 11), forming a conductive layer on the barrier layer to be within and/or fill a remaining portion of the cell trench 192 (see FIG. 11) and a remaining portion of the through hole 194 (see FIG. 11), and planarizing the conductive layer and the barrier layer to expose the upper surface of the second upper insulating interlayer 116. The barrier layer may conformally cover an inner surface of the cell trench 192 (see FIG. 11) and an inner surface of the through hole 194 (see FIG. 11). The barrier layer may include conductive metal nitride. The conductive layer may include metal, e.g., copper. By the above planarization process, an upper surface of the cell conductive line 130 and an uppermost surface of the cell barrier pattern 132 may be substantially coplanar with the upper surface of the second upper insulating interlayer 116 on the cell region CR. In addition, an upper surface of the conductive pattern 140, i.e., an upper surface of the line part 144, and an uppermost surface of the peripheral barrier pattern 142 may be substantially coplanar with the upper surface of the second upper insulating interlayer 116 on the peripheral circuit region PR.

According to example embodiments of the inventive concepts, referring to FIG. 11, the cell trench 192 and the through hole 194 that have different aspect ratios may be simultaneously formed by the first etching process. The through hole 194 may include the peripheral trench 196 and the contact holes 198 extending from the peripheral trench 196 toward the substrate 100. Each of the contact holes 198 may be formed to have the width 198W that increases as a distance from the substrate 100 increases and to have the inner sidewall corresponding to the sidewall INP_S of the insulating pattern INP having the stepped profile. In some embodiments, the conductive layer may more easily fill the relatively high aspect ratio through hole 194.

Figure 12:
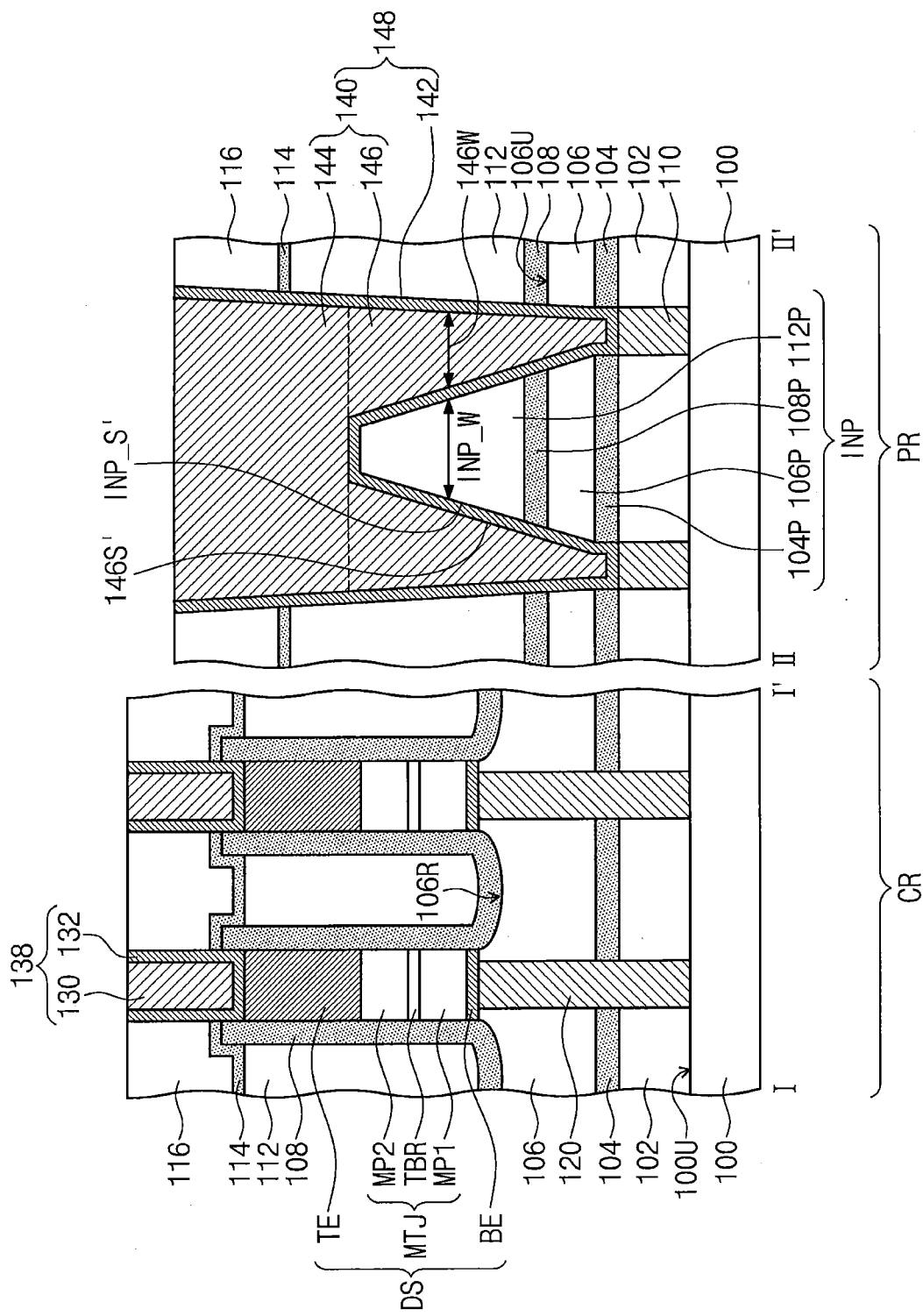
FIG. 12 is a cross-sectional view taken along lines I-I' and II-II' of FIG. 3, illustrating a semiconductor device according to example embodiments of the inventive concepts.

FIG. 12 is a cross-sectional view taken along lines I-I' and II-II' of FIG. 3, illustrating a semiconductor device according to example embodiments of the inventive concepts. Detailed descriptions of the same contents as those of the above-described embodiments of FIGS. 3, 4, 5A and 5B, are omitted for brevity Referring to FIG. 12, the peripheral interconnection structure 148 may be disposed on the peripheral circuit region PR of the substrate 100. The peripheral interconnection structure 148 may include the conductive pattern 140 and the peripheral barrier pattern 142. The conductive pattern 140 may include the line part 144 extending in the direction parallel to the upper surface 100U of the substrate 100, e.g., the first direction D1, and the contact parts 146 extending from the line part 144 toward the substrate 100. The contact parts 146 may be laterally separated from each other by the insulating pattern INP therebetween.

Each of the contact parts 146 may have the width 146W in the direction parallel to the upper surface 100U of the substrate 100, e.g., the first direction D1. The width 146W of each of the contact parts 146 may increase as a distance from the substrate 100 increases. The insulating pattern INP may have the width INP_W in the direction parallel to the upper surface 100U of the substrate 100, e.g., the first direction D1. The width INP_W of the insulating pattern INP may decrease as a distance from the substrate 100 increases.

In cross-sectional view, the insulating pattern INP may have the opposite sidewalls INP_S'. Each of the sidewalls INP_S' of the insulating pattern INP may face a sidewall 146S' of each of the contact parts 146. Each sidewall INP_S' of the insulating pattern INP may have a linear profile with respect to the upper surface 100U of the substrate 100. The sidewall 146S' of each of the contact parts 146 may have a shape corresponding to the shape of each of the sidewalls INP_S' of the insulating pattern INP. The sidewall 146S' of each of the contact parts 146 may have a linear profile with respect to the upper surface 100U of the substrate 100.

Figure 13:
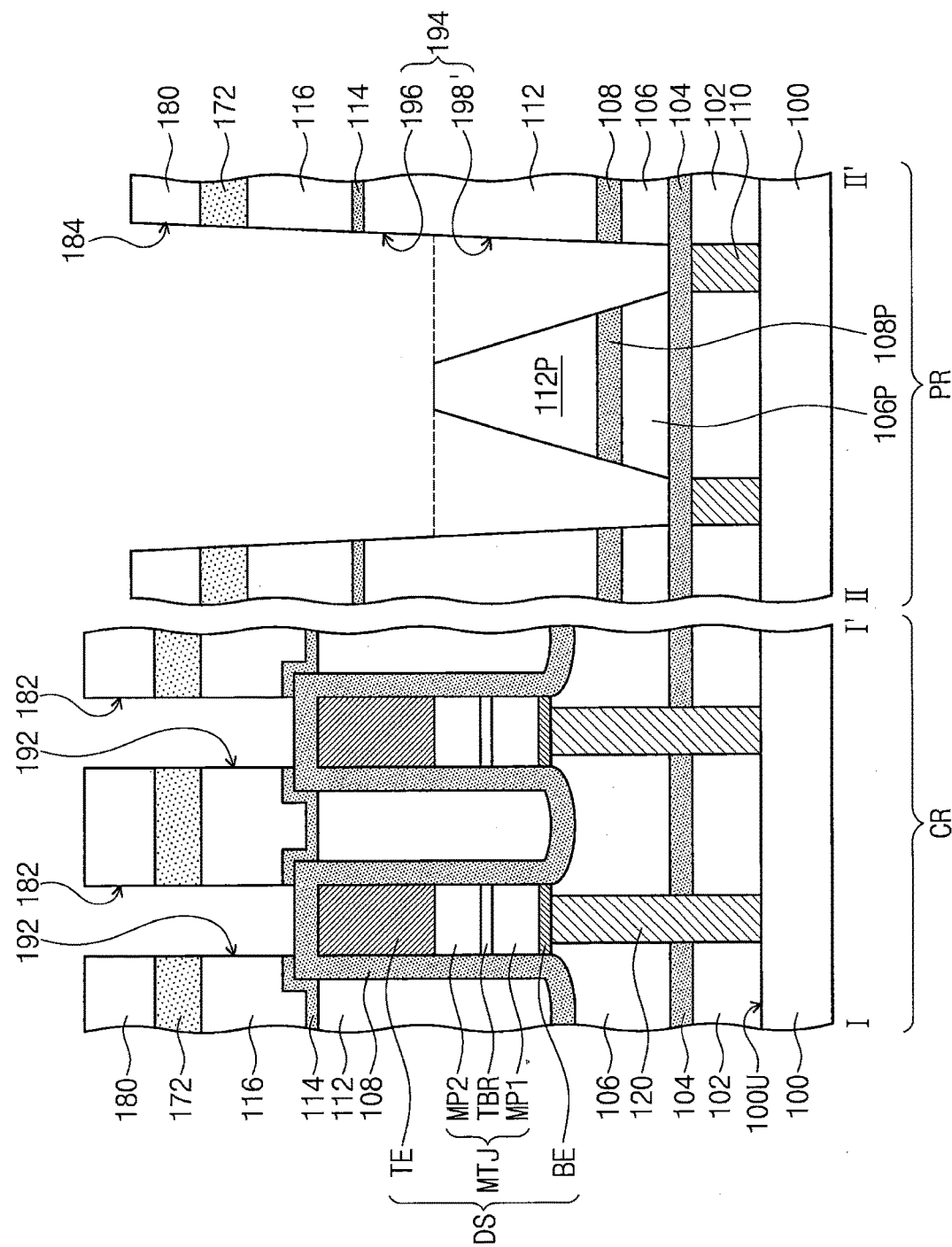
FIG. 13 is a cross-sectional view taken along lines I-I' and II-II' of FIG. 3, illustrating a method of manufacturing a semiconductor memory device according to example embodiments of the inventive concepts.

FIG. 13 is a cross-sectional view taken along lines I-I' and II-II' of FIG. 3, illustrating a method of manufacturing a semiconductor memory device according to example embodiments of the inventive concepts. Detailed descriptions of the same or similar content as those of the above-described embodiments of FIGS. 6 to 11 are omitted for brevity Referring to FIG. 13, the first etching process may be performed using the mask layer 180 as an etch mask. On the cell region CR, the sacrificial layer 172 and the second upper insulating interlayer 116 may be patterned by the first etching process, thus forming the cell trench 192 in the second upper insulating interlayer 116. The upper insulating layer 114 on the cell region CR may be patterned by the first etching process such that the cell trench 192 may extend into the upper insulating layer 114. The first etching process may be performed until the protection insulating layer 108 on the cell region CR is exposed.

On the peripheral circuit region PR, the sacrificial layer 172, the second upper insulating interlayer 116, the upper insulating layer 114, the first upper insulating interlayer 112, the protection insulating layer 108, and the first lower insulating interlayer 106 may be patterned by the first etching process, thus forming the through hole 194 on the peripheral circuit region PR. The through hole 194 may include the peripheral trench 196 extending in the direction parallel to the upper surface 100U of the substrate 100, e.g., the first direction D1, and the contact holes 198' extending from the peripheral trench 196 toward the substrate 100. The contact holes 198' may be laterally spaced from each other. The peripheral trench 196 may be commonly connected to the contact holes 198'. The first etching process may be performed until the lower insulating layer 104 on the peripheral circuit region PR is exposed. The cell trench 192 on the cell region CR and the through hole 194 on the peripheral circuit region PR may be simultaneously formed by the first etching process.

On the peripheral circuit region PR, the portion 112P of the first upper insulating interlayer 112, the portion 108P of the protection insulating layer 108, and the portion 106P of the first lower insulating interlayer 106 may not be etched by the first etching process and remain between the contact holes 198'. During the first etching process, etch rates of the second upper insulating interlayer 116, the upper insulation layer 114, the second upper insulating interlayer 112, the protection insulation layer 108, and the first lower insulating interlayer 106 may be substantially the same, Thus, a sidewall of the portion 112P of the first upper insulating interlayer 112, a sidewall of the portion 108P of the protection insulating layer 108, and a sidewall of the portion 106P of the first lower insulating interlayer 106 may be aligned with one another and have a sloped linear profile with respect to the upper surface 100U of the substrate 100.

According to example embodiments of the inventive concepts, the cell trench 192 and the through hole 194 that have different aspect ratios may be simultaneously formed by the first etching process. The relatively high aspect ratio of the through hole 194 may be formed to have a structure in which the peripheral interconnection structure 148 is easily formed therein. Thus, the peripheral interconnection structure 148 may be easily formed in the through hole 194, such that defects in the peripheral interconnection structure 148 may be reduced or prevented from occurring. Therefore, the semiconductor device having an improved property may be manufactured.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:
1. A semiconductor device comprising:
   a substrate;
   a first lower insulating interlayer, a protection insulating layer, and a first upper insulating interlayer that are sequentially stacked on the substrate; and
   a conductive pattern penetrating the first upper insulating interlayer, the protection insulating layer; and the first lower insulating interlayer,
   wherein the conductive pattern comprises a line part extending in a direction parallel to an upper surface of the substrate and contact parts extending from the line part toward the substrate,
   wherein the contact parts are spaced apart from each other with an insulating pattern therebetween,
   wherein the insulating pattern comprises a portion of the first upper insulating interlayer, a portion of the protection insulating layer, and a portion of the first lower insulating interlayer, and
   wherein at least a portion of the insulating pattern has a stepped profile.

2. The semiconductor device of claim 1, wherein each of the contact parts has a width that increases as a distance from the substrate increases.

3. The semiconductor device of claim 2, wherein the insulating pattern has a width that decreases as the distance from the substrate increases.

4. The semiconductor device of claim 1, wherein a sidewall of the portion of the first upper insulating interlayer has a stepped profile.

5. The semiconductor device of claim 1, wherein the line part penetrates an upper portion of the first upper insulating interlayer, and
wherein each of the contact parts penetrates a lower portion of the first upper insulating interlayer, the protection insulating layer, and the first lower insulating interlayer.

6. The semiconductor device of claim 1, wherein the protection insulating layer comprises a material that is different from the first upper insulating interlayer and the first lower insulating interlayer, and
wherein the line part and the contact parts comprise a same material.

7. The semiconductor device of claim 1, wherein the substrate comprises a cell region and a peripheral circuit region,
wherein the first lower insulating interlayer, the protection insulating layer, and the first upper insulating interlayer are on the cell region and the peripheral circuit region,
wherein the conductive pattern is on the peripheral circuit region,
wherein the semiconductor device further comprises a data storage structure on the first lower insulating interlayer on the cell region,
wherein the first upper insulating interlayer is on the data storage structure,
wherein the protection insulating layer is between a sidewall of the data storage structure and the first upper insulating interlayer and between the first lower insulating interlayer and the first upper insulating interlayer that are on the cell region, and
wherein the protection insulating layer extends between the first lower insulating interlayer and the first upper insulating interlayer that are on the peripheral circuit region.

8. The semiconductor device of claim 7, wherein a first upper surface of the first lower insulating interlayer on the peripheral circuit region is lower than a second upper surface of the first lower insulating interlayer on the cell region, with respect to the substrate.

9. The semiconductor device of claim 7, further comprising:
a second upper insulating interlayer on the first upper insulating interlayer; and
an upper insulating layer between the first upper insulating interlayer and the second upper insulating interlayer,
wherein the second upper insulating interlayer and the upper insulating layer are on the cell region and the peripheral circuit region, and
wherein the line part penetrates the second upper insulating interlayer and the upper insulating layer.

10. The semiconductor device of claim 9, wherein the upper insulating layer comprises a material that is different from the first and second upper insulating interlayers.

11. The semiconductor device of claim 9, further comprising:
a cell conductive line on the data storage structure,
wherein the cell conductive line penetrates the second upper insulating interlayer and the upper insulating layer and is connected to the data storage structure, and
wherein the cell conductive line, the line part, and the contact parts comprise a same material.

12. The semiconductor device of claim 1, further comprising:
a second lower insulating interlayer between the substrate and the first lower insulating interlayer;
a lower insulating layer between the first lower insulating interlayer and the second lower insulating interlayer; and
peripheral conductive lines in the second lower insulating interlayer,
wherein the contact parts penetrate the lower insulating layer and are connected to the peripheral conductive lines, respectively,
wherein the insulating pattern further comprises a portion of the lower insulating layer, and
wherein the lower insulating layer comprises a material that is different from the first and second lower insulating interlayers.

13. A semiconductor device comprising:
a substrate comprising a cell region and a peripheral circuit region;
a first lower insulating interlayer on the cell region and the peripheral circuit region;
a data storage structure on the first lower insulating interlayer on the cell region;
a first upper insulating interlayer on the cell region and the peripheral circuit region, the first upper insulating interlayer on the data storage structure;
a protection insulating layer between a sidewall of the data storage structure and the first upper insulating interlayer and between the first lower insulating interlayer and the first upper insulating interlayer that are on the cell region and the peripheral circuit region; and
a conductive pattern penetrating the first upper insulating interlayer, the protection insulating layer, and the first lower insulating interlayer that are on the peripheral circuit region,
wherein the conductive pattern comprises a line part and contact parts,
wherein the line part extends in a direction parallel to an upper surface of the substrate,
wherein the contact parts extend from the line part toward the substrate and are laterally spaced apart from each other with an insulating pattern therebetween,
wherein the insulating pattern comprises a portion of each of the first upper insulating interlayer, the protection insulating layer, and the first lower insulating interlayer, and
wherein each of the contact parts has a width that increases as a distance from the substrate increases.

14. The semiconductor device of claim 13, wherein the insulating pattern has a width that decreases as the distance from the substrate increases.

15. The semiconductor device of claim 13, wherein the protection insulating layer comprises a material that is different from the first upper insulating interlayer and the first lower insulating interlayer.

16. The semiconductor device of claim 13, wherein the line part and the contact parts comprise a same material.

17. The semiconductor device of claim 13, further comprising:

a second lower insulating interlayer between the substrate and the first lower insulating interlayer, the second lower insulating interlayer on the cell region and the peripheral circuit region;

a lower insulating layer between the first lower insulating interlayer and the second lower insulating interlayer, the lower insulating layer on the cell region and the peripheral circuit region; and peripheral conductive lines in the second lower insulating interlayer on the peripheral circuit region, wherein the contact parts penetrate the lower insulating layer and are connected to the peripheral conductive lines, respectively, and wherein the lower insulating layer comprises a material that is different from the first and second lower insulating interlayers.

18. A semiconductor device comprising:

a substrate;

a first lower insulating interlayer on the substrate;

a protection insulating layer on a first lower insulating interlayer on the substrate;

a first upper insulating interlayer on the protection insulating layer; and a conductive pattern comprising a first part and a plurality of second parts, wherein the first part is within the first upper insulating interlayer, wherein the plurality of second parts are respectively within the first upper insulating interlayer, the protection insulating layer, and the first lower insulating interlayer, wherein the plurality of second parts are spaced apart from each other in a first direction that is parallel to an upper surface of the substrate, wherein at least a portion of a sidewall of at least one of the second parts comprises a stepped profile.

19. The semiconductor device of claim 18, wherein the plurality of second parts are spaced apart from each other in the first direction with an insulating pattern therebetween, and wherein the insulating pattern comprises a portion of the first upper insulating interlayer, a portion of the protection insulating layer, and a portion of the first lower insulating interlayer.

20. The semiconductor device of claim 19, wherein the plurality of second parts respectively have a width that is tapered toward the substrate, and wherein the insulating pattern has a width that is tapered away from the substrate.

* * * * *